United States Patent [19]

Crewe

[11] Patent Number: 5,008,549
[45] Date of Patent: Apr. 16, 1991

[54] HIGH PERFORMANCE, VACUUM COMPATIBLE ELECTROMAGNETIC LENS COIL

[75] Inventor: Albert V. Crewe, Palos Park, Ill.
[73] Assignee: Orchid One Corporation, Palos Hills, Ill.
[21] Appl. No.: 507,170
[22] Filed: Apr. 10, 1990
[51] Int. Cl.⁵ .............................................. H01F 7/22
[52] U.S. Cl. .......................... 250/396 ML; 250/396 R
[58] Field of Search ............... 250/396 ML, 396 R; 174/102 C, 102 A, 125.1, 124 GL, 124 C, 124 R; 336/205, 222; 335/213, 214, 299, 300, 216; 427/118, 307, 322, 431, 432

[56] References Cited

U.S. PATENT DOCUMENTS

| | | |
|---|---|---|
| 3,743,986 | 7/1973 | McInturff et al. ............... 174/125.1 |
| 3,983,521 | 9/1976 | Furuto et al. . |
| 4,078,299 | 3/1978 | Furuto et al. . |
| 4,329,539 | 5/1982 | Tanaka et al. . |
| 4,390,589 | 6/1983 | Geyling et al. . |
| 4,611,390 | 9/1986 | Tanaka et al. . |
| 4,782,316 | 11/1988 | Domeki et al. ..................... 335/299 |
| 4,833,362 | 5/1989 | Crewe ................................ 313/561 |

Primary Examiner—Jack I. Berman
Assistant Examiner—Kiet T. Nguyen

[57] ABSTRACT

A high performance, vacuum compatible electromagnetic electron lens coil for electron beam systems has reduced gaseous emissions and improved heat dissipation capability. It comprises a wound coil of electrically conductive wire sheathed in a selected thermoplastic resin insulator. The wire insulator is coated with a hermetic layer of low vapor pressure metal. The low vapor pressure and hermetic sealing properties of the layer provide ultra high vacuum compatibility of the coil. The high thermal conduction property of the layer provides high heat dissipation capability and therefore permits high current densities in the coil.

30 Claims, 3 Drawing Sheets

HIGH PERFORMANCE, VACUUM COMPATIBLE ELECTROMAGNETIC LENS COIL

BACKGROUND OF THE INVENTION

This invention relates to electromagnetic coils for electron lenses, particularly for use in electron microscopes, electron beam inspection systems and the like. Such coils are difficult to cool, which constrains the current density they can handle, and they are incompatible with the high vacuum environment in which they operate, due to the plastic insulator used on the coil wire and air trapped in the coil during the winding process. These coil limitations have in turn fettered the performance and raised the cost of the embodying magnetic lenses and the systems which incorporate such lenses.

To assure against overheating and consequent damage to the coil wire insulation, the current density in such coils must be kept low enough to maintain acceptable heat levels at the core of the coil. (Since wire insulation is a poor thermal conductor, heat generated in the interior of the coil sees a high thermal impedance path to the coil exterior.) But low current density necessitates undesirably large (and expensive) coil structures to achieve a desired lens power.

Secondly, because of the incompatibility of the coil with a high vacuum environment, due to outgassing of insulator hydrocarbons and escape of trapped air, such coils must be sealed from the high vacuum environment in which they operate.

One approach is to seal the coil from the high vacuum environment but couple it to air. An alternate approach is to hermetically encapsulate the lens coil within the vacuum environment and in that may isolate it from the high vacuum environment. In both approaches the lens coil is actually hermetically sealed from the electron beam passing through it and upon which it must act. Both approaches are undesirable, yielding somewhat inefficient, expensive and bulky arrangements.

Prior to this invention there did not exist an electromagnetic coil suitable for magnetic lenses, operable in a high vacuum environment at high efficiency and without causing significant degradation of the quality of its environment.

OBJECTS OF THE INVENTION

Accordingly, it is an object of this invention to provide an electromagnetic lens coil for electron microscopes, electron beam inspection equipment and the like which is capable of being operated at high current densities, and thus which can either be configured to be extremely compact, or operated at high current levels.

It is another object of this invention to provide an electromagnetic lens coil for electron beam systems which is so compatible with a vacuum environment that it may be situated in such a environment without hermetic isolation therefrom.

It is a subsidiary object to provide an improved lens coil for electron beam system which will not degrade the quality of a vacuum environment, either by emission of air trapped during the coil winding process, or by outgassing from the coil wire insulator.

It is thus an object of this invention to provide an electromagnetic lens coil for electron beam systems which results in lower system cost, and which is more efficient due to elimination altogether of the encapsulation structures needed to isolate prior coil structures from their vacuum operating environment and the influenced electron beam.

It is yet another object of this invention to provide an improved method of manufacturing electromagnetic lens coils for use in electron microscopes, electron beam inspection systems and the like.

It is still another object of this invention to provide an improved coil wire coating material which greatly improves the heat dissipation of a lens coil or the like and which is capable of being coated on insulated coil wire without damage to the wire insulation. It is a further object to provide such a coating which is supremely compatible with a high vacuum environment.

It is yet another object of this invention to provide an electromagnetic coil of general applicability which may be operated at higher than normal current densities due to improved to heat dissipation capability.

PRIOR ART

The use of soft metals and metal alloys between superconducting compounds in superconducting compound stranded cable structures as a stabilizing element is known, as is methods of plating with such soft metals. See U.S. Pat. Nos. 3,983,521; 4,078,299; 4,329,539; and 4,611,390.

It is known to provide electromagnetic coils having sheets of copper between layers of the coil for the purpose of improving the heat dissipation from the coil. It is also known to pot coils in epoxy.

Also U.S. Pat. No. 4,390,589.

BRIEF DESCRIPTION OF THE PREFERRED EMBODIMENTS

Figure 1:
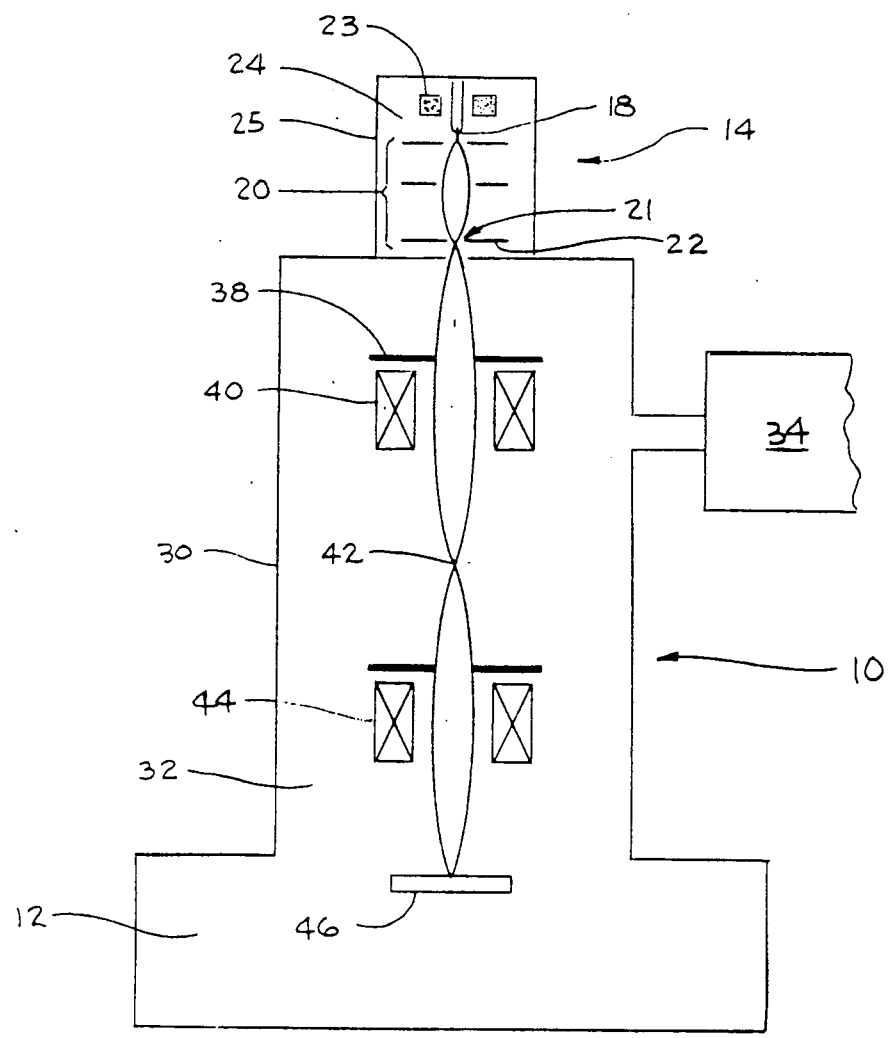
FIG. 1 is a highly schematic view of an electron microscope in which this invention may be employed.

The principles of this invention may be employed in connection with a variety of electron beam systems. FIG. 1 illustrates an electron beam microscope with which the present invention may be utilized. The FIG. 1 microscope is illustrated as comprising an electron beam column 10 and a specimen chamber 12. Mounted on the column 10 is an encapsulated high brightness electron source 14 which may be constructed in accordance with the teachings of my U.S. Pat. No. 4,833,362.

The source 14 is illustrated as including a field emission tip 18 and an electrostatic lens 20 which forms an image of the electron source at the tip 18 on axis in the vicinity of a differential pressure aperture 21 formed in one of the lens elements 22. An evaporated porous getter 23 is used to pump an ultra high vacuum enclosure 24 to ultra high vacuum levels suitable for operation of the field emission tip 18. Source vacuum enclosure means 25 defines the ultra high vacuum source enclosure 24.

FIG. 1 illustrates schematically a system vacuum enclosure means 30 which defines therewithin a system vacuum enclosure 32. A vacuum pump 34 is illustrated schematically for pumping the system vacuum enclosure to suitable vacuum levels—typically $10^{-5}$ to $10^{-6}$ Torr. A stop 38 limits and defines the beam. A condenser lens is illustrated at 40 for forming an intermediate beam crossover 42. An objective lens 44 images the beam crossover 42 on a specimen supported by a specimen holder 46. The condenser lens 40 is shown for completeness although in many applications it may not be necessary.

Figure 2:
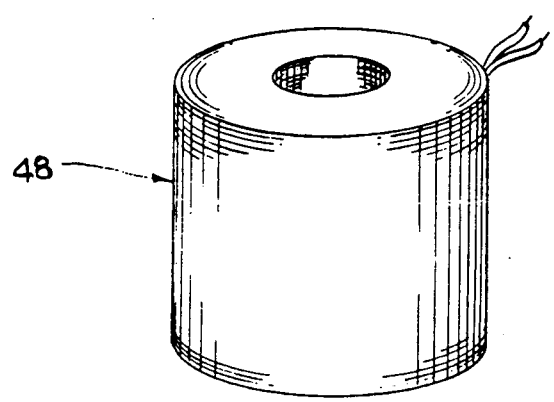
FIG. 2 is a schematic perspective view of an electromagnetic lens coil constructed in accordance with the teachings of the present invention.
Figure 3:
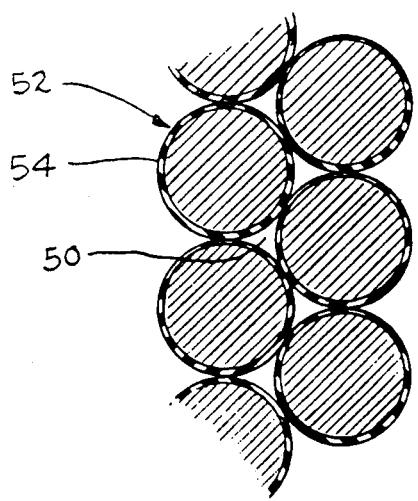
FIG. 3 is an enlarged fragmentary schematic section view of a prior art electromagnetic coil.

FIG. 2 shows in perspective and in highly schematic form an electromagnetic coil 48 constructed in accordance with this invention. The coil may be condenser lens 40 or objective lens 44, for example. As discussed above, prior art coils, a fragment of which is represented in FIG. 3, have two major shortcomings—they are difficult to cool and therefore must be run at lower than desired current densities due to their propensity to generate heat in the coil center. It can be seen that the air spaces 50 between the conductor turns 52 and the many layers of insulator 54 create a high thermal impedance path for heat generated within the interior of the coil, with the result that heat rapidly builds up in such prior art coils if high current densities are developed.

Figure 4:
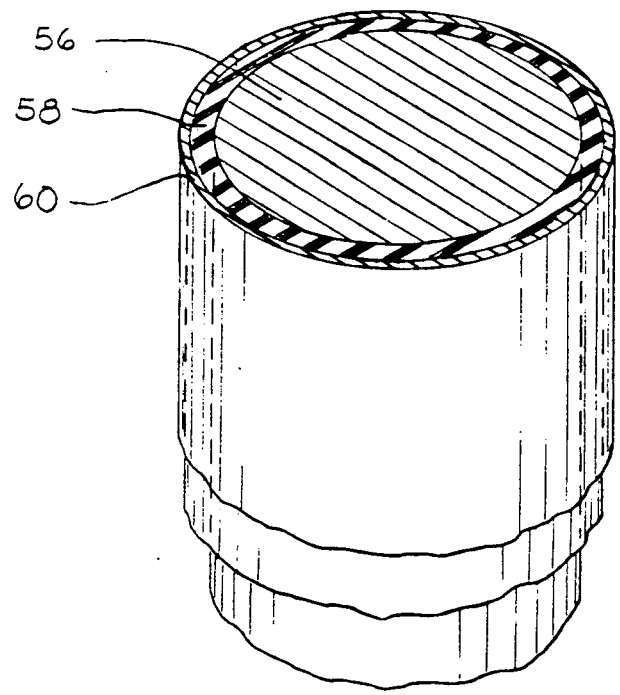
FIG. 4 is an enlarged sectioned view of a turn of wire embodying the teachings of this invention.
Figure 5:
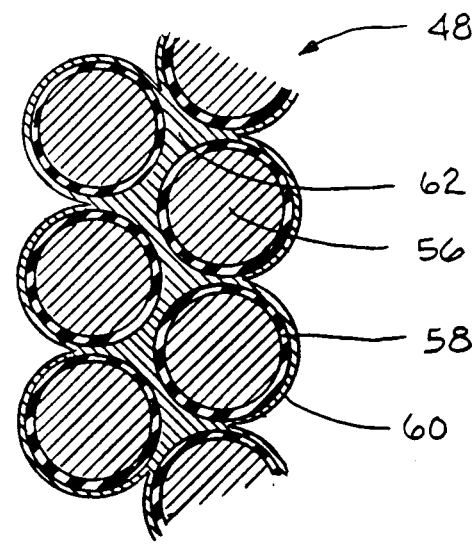
FIG. 5 is an enlarged schematic fragmentary view of a fragment of a coil constructed in accordance with the present invention.

Secondly, prior art coils are incompatible with a vacuum environment for the reason that air trapped in the air spaces 50 and outgassing from the coil insulator 54 will contaminate the vacuum environment. FIGS. 4-5 illustrate an embodiment of the present invention—specifically, a high performance, vacuum-compatible electromagnetic lens coil for electron beam systems having reduced gaseous emissons and improved heat dissipation capability. The coil 48 comprises a series of windings of electrically conductive wire 56 sheathed in a selected thermoplastic resin insulator 58. In accordance with this invention the wire insulator 58 is coated with a hermetic layer 60 of low vapor pressure metal. The low vapor pressure of the metal and hermetic sealing properties of the metal layer 60 provide vacuum compatibility of the coil 48, while the high thermal conduction property of the layer 60 provides high heat dissipation capability and therefore permits high current densities in the coil 48. By this invention, the coil 48 can provide low cost, highly efficient, high electromagnetic performance in an unsealed state in a vacuum environment.

The metal of the layer 60 has a melting temperature which is greater than the decomposition temperature of the insulator 58. As will be described in more detail hereinafter, this combination of characteristics of the insulator 58 and the metal layer 60 prevents the insulator 58 from being damaged in the process of applying the layer 60 while in its molten state.

As will be explained hereinafter, a soft metal such as indium is desired in order that during the coil winding process, the interstices 62 between the coil turns fills in to eliminate air spaces such as shown at 50 in the prior art structure illustrated in FIG. 3.

Whereas a harder metal such as copper or aluminium has the favorable properties of conducting heat from the coil, the heat dissipation will not be quite as good as with a softer metal such as indium due to the incomplete elimination of the air spaces. Further, as described above, the presence of air spaces between the turns of the coil is apt to lead to outgassing when the coil is placed in an operating vacuum environment.

It is important to use an insulator 58 which has a higher decomposition temperature than the melting temperature of the metal layer 60. Very satisfactory results have been obtained, then, using indium as the metal for layer 60, indium having a melting temperature of approximately 160 degrees centigrade. An insulator composed of polyimide, for example, which has a decomposition temperature of 170-180 degrees centigrade, will not decompose upon application of indium in a molten phase. It has been found that application of molten indium to a polyimide insulator does not in any way damage the insulator. Other suitable insulator materials may be employed, a prime property being, as explained, a decomposition temperature which is higher than the melting temperature of the metal layer 60 employed.

In a preferred embodiment, the wire 56 constituting the core of the structure, is composed of copper, and may, in a typical application be, for example 0.050 inch in diameter. In that application, the thickness of the thermoplastic resin insulator may be, for example, 0.001 inch and the metal layer 0.001 inch.

A method of manufacturing a coil according to the teachings of the present invention will now be described, specifically in the context of a coil having a layer of indium on a polyimide insulator.

Figure 6:
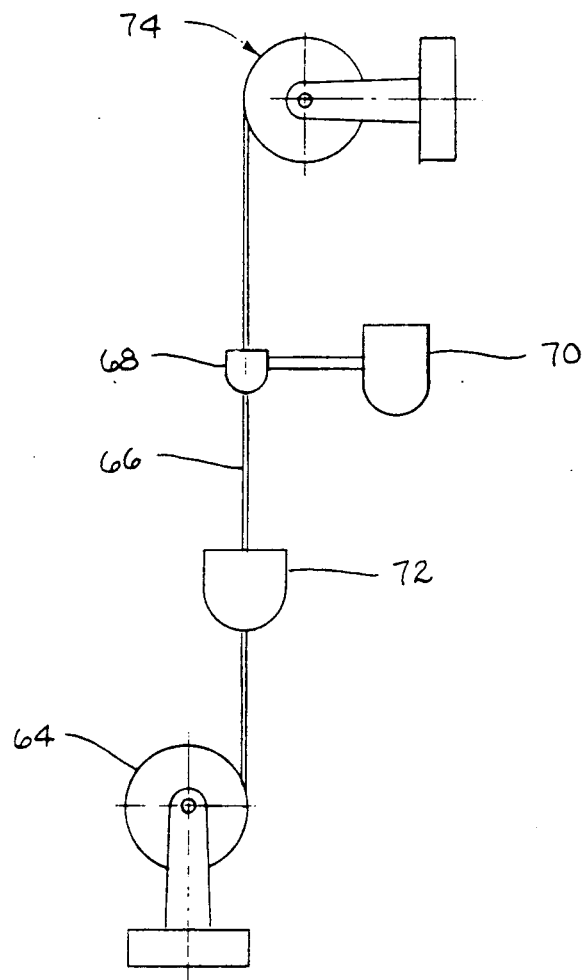
FIG. 6 illustrates in highly schematic form a wire-coating method following the present invention.

It has been found that indium may be coated on wire having a polyimide insulator by drawing the insulated wire through a molten bath of indium. See FIG. 6. FIG. 6 illustrates schematically a supply spool 64 holding a supply of uncoated insulated wire. A strand 66 of wire from the spool 64 is fed through a heated container 68 containing a pool of liquid indium supplied from a reservoir 70.

It has been found to be very important to have the insulator extremely clean before it is passed through the molten pool of indium. Accordingly, the strand 66 is shown as being drawn through a bath 72 of a suitable solvent such as acetone. The insulator must be cleaned immediately prior to passing the insulated wire through the molten indium. Tests have shown that if the insulated wire is permitted to remain in a normal contaminated ambient environment for even a brief period, it will become recontaminated and the molten indium will not wet and adhere to the insulator satisfactorily.

The cleaned coated strand 66 is stored on a take-up spool 74.

To fabricate an electromagnetic coil 48 as shown, a strand of wire, metal-coated as described, is drawn from a supply such as take-up spool 74. In a process not illustrated, the metal-coated wire is wound tightly to form coil 48 as shown in FIG. 5. Because indium is a soft metal, the soft indium layer will be distorted and will effectively flow to fill the interstices 62 between the windings and eliminate substantially all air space therebetween, as shown in FIG. 5.

An alternative method of forming a high performance, vacuum-compatible electromagnetic coil in accordance with the present invention is to pot the coil. After having coated the strand of wire with a layer or indium or other suitable metal, e.g. by using the process described in FIG. 6, the strand is wound into a coil. In this process, the coil winding need not be as tight as described above, as the air spaces will be extinguished during the potting process to be described.

Figure 7:
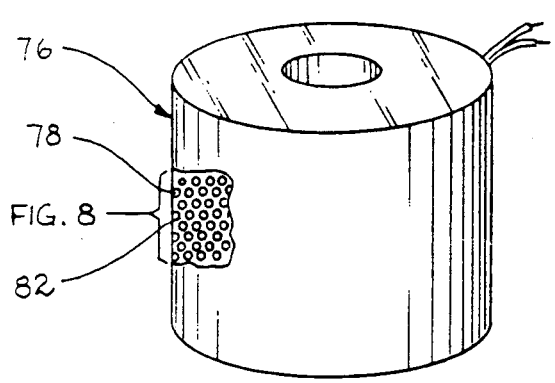
FIGS. 7 and 8 are perspective and enlarged fragmentary views of an alternative embodiment of the invention.
Figure 8:
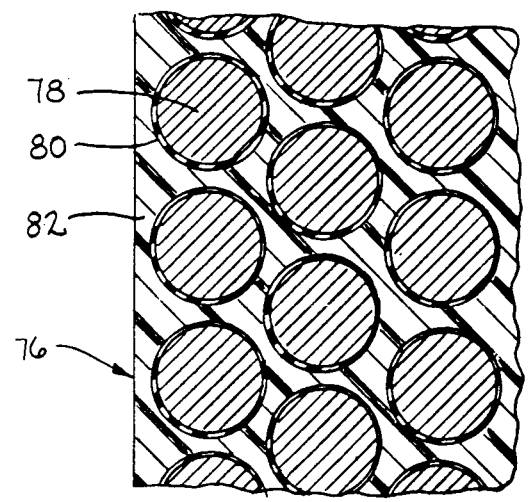

The coil is placed in a potting form and molten indium is poured into the form. Because the insulated wires have been coated with indium, the molten indium will wet the coated wires and completely fill in all of the interstices 62 between the turns of wire. The resultant coil 76 is shown in FIG. 7 and comprises conductor 78 sheathed in an insulator 80, embedded in a casting of potting material 82. A potted coil made according to this last described method will appear as shown in FIGS. 7-8.

The coil may be potted in a material other than the metal layer 60 on the wire 56, so long as the potting metal has the properties of (1) ability to wet the metal layer, (2) good heat conduction capability and (3) compatibility with a vacuum environment.

Other applications for the coil of the present invention, than the condenser or objective lens coils 40, 44 may be employed. For example, a coil constructed according to the present invention may be advantageously used as a replacement for the electrostatic lens 20 shown in the source module. Other applications in electron beam systems are contemplated.

As noted, metals other than pure or alloyed indium may be employed for the layer 60 or the potting material. Wire insulator compositions other than polyimides may be employed.

The following claims are intended to cover not only the illustrated structure and methods, but other structures and methods which utilize my teachings and are within the spirit and scope of the invention.

What is claimed is:

1. A high performance, vacuum compatible electromagnetic electron lens coil for electron beam systems having reduced gaseous emissions and improved heat dissipation capability, comprising a wound coil of electrically conductive wire sheathed in a selected thermoplastic resin insulator, said wire insulator being coated with a hermetic layer of low vapor pressure metal, the low vapor pressure and hermetic sealing properties of the layer providing ultra high vacuum compatibility of the coil, while the high thermal conduction property of the layer provides high heat dissipation capability and therefore permits high current densities in the coil, whereby said coil can provide low cost, highly efficient, high electromagnetic performance in an unsealed state in a high vacuum environment.

2. The coil defined by claim 1 wherein said metal has a melting temperature which is no greater than the decomposition temperature of said insulator.

3. The coil defined by claim 1 wherein said metal is pure or alloyed indium, copper or aluminum.

4. The coil defined by claim 3 wherein said metal is pure or alloyed indium and said insulator is a polyimide.

5. A vacuum compatible electromagnetic electron lens coil for electron beam systems having reduced gaseous emissions and improved heat dissipation capability, comprising a wound coil of electrically conductive wire sheathed in a selected thermoplastic resin insulator, said wire insulator being coated with a layer of pure or alloyed indium effective to conduct heat generated within the coil to the coil exterior.

6. A high performance, vacuum compatible electromagnetic electron lens coil for electron beam systems having reduced gaseous emissions and improved heat dissipation capability, comprising a wound coil of electrically conductive wire sheathed in a selected thermoplastic resin insulator, the coil being hermetically sealed in a relatively soft, low vapor pressure metal, the low vapor pressure and hermetic sealing properties of the metal providing ultra high vacuum compatibility of the coil, while the high thermal conduction property of the layer provides high heat dissipation capability and therefore permits high current densities in the coil, whereby said coil can provide low cost, highly efficient, high electromagnetic performance in an unsealed state in a high vacuum environment.

7. The coil defined by claim 6 wherein said metal has a melting temperature which is no greater than the decomposition temperature of said insulator.

8. The coil defined by claim 7 wherein said metal is pure or alloyed indium.

9. The coil defined by claim 1 wherein said insulator is a polyimide.

10. A high performance vacuum-compatible electromagnetic lens coil for electron beam systems having reduced gaseous emissions and improved heat dissipation capability, comprising a wound coil of electrically conductive wire sheathed in a selected thermoplastic resin insulator, said coil being potted in pure or alloyed indium effective to conduct heat generated within the coil to the coil exterior and to reduce emissions from the insulator when the coil is placed in a vacuum.

11. An electron beam system, comprising:
vacuum enclosure means and means for pumping said enclosure to a predetermined high vacuum;
means including a cathode for generating a source of electrons and for developing an electron beam therefrom; and
electromagnetic lens means for receiving said electron beam and, when excited, for forming a magnetic field capable of modifying said beam, said magnetic lens means including a high performance, vacuum-compatible electromagnetic coil having reduced gaseous emissions and improved heat dissipation capability, comprising a wound coil of electrically conductive wire sheathed in a selected thermoplastic resin insulator, said wire insulator being hermetically sealed in low vapor pressure metal, the low vapor pressure and hermetic sealing properties of the layer providing compatibility of the coil with said predetermined high vacuum in said enclosures, while the high thermal conduction property of the layer provides high heat dissipation capability and therefore permits high current densities in the coil, whereby said coil can provide low cost, highly efficient, high performance in an unsealed state in said high vacuum enclosure.

12. The system defined by claim 11 wherein said metal has a melting temperature which is no greater than the decomposition temperature of said insulator.

13. The system defined by claim 12 wherein said metal is pure or alloyed indium.

14. A differential pressure electron beam system, comprising:
system vacuum enclosure means defining a system vacuum enclosure;
source vacuum enclosure means defining a source vacuum enclosure, said source vacuum enclosure means defining a differential pressure aperture communicating with said system vacuum enclosure,
a field emission cathode within said source vacuum enclosure requiring an ultra high vacuum environment for efficient operation, non-evaporable porous getter means within or in communication with said source vacuum enclosure for passively pumping said source vacuum enclosure at a predetermined ultra high vacuum level, means for receiving electrons from said field emission cathode and for forming an electron beam therefrom, and electromagnetic lens means for receiving said beam and forming a magnetic field capable of modifying said electron beam, said magnetic lens means including a high performance, vacuum compatible electromagnetic coil having reduced gaseous emissions and improved heat dissipation capability, comprising a wound coil of electrically conductive wire sheathed in a selected thermoplastic resin insulator, said wire insulator being hermetically sealed in a low vapor pressure metal, the low vapor pressure and hermetic sealing properties of the metal providing vacuum compatibility of the coil, while the high thermal conduction property of the layer provides high heat dissipation capability and therefore permits high current densities in the coil, whereby said coil can provide low cost, highly efficient, high electromagnetic performance in an unsealed state in a vacuum environment.

15. The system defined by claim 14 wherein said metal has a melting temperature which is no greater than the decomposition temperature of said insulator.

16. The system defined by claim 15 wherein said metal is indium.

17. The system defined by claim 14 wherein said insulator is a polyimide.

18. A method of making a high performance vacuum-compatible electromagnetic electron lens coil for electron microscopes, electron beam inspection devices and the like having improved heat dissipation capability, comprising:

providing a coil of electrically conductive wire sheathed in a selected thermoplastic resin insulator;

coating said wire insulator with a hermetic layer of low vapor pressure metal; and winding said wire into a coil with said metal layer in contact throughout said coil such that said layer is effective to conduct heat generated within said coil to the coil exterior, thus improving the maximum current density capability of the coil.

19. The method defined by claim 18 wherein said metal is pure or alloyed aluminum, copper or indium.

20. The method defined by claim 19 wherein the metal has a melting temperature which is no greater than the decomposition temperature of said insulator.

21. The method defined by claim 20 wherein said insulator is a polyimide.

22. A method of making a high performance vacuum-compatible electromagnetic lens coil for electron beam systems having reduced gaseous emissions and improved heat dissipation capability, comprising:

providing a coil of electrically conductive wire sheathed in a selected thermoplastic resin insulator;

coating said wire insulator with a hermetic layer of low vapor pressure metal;

winding said wire into a coil with said metal layer in contact throughout; and potting said wound coil in a material effective to wet said metal layer and to conduct heat generated within the coil to the coil exterior and to reduce emissions from the insulator when the coil is placed in a vacuum, the low vapor pressure and hermetic sealing properties of the layer providing ultra high compatibility of the coil while the high thermal conduction property of the layer provides high heat dissipation capability and therefore permits high current densities in the coil, whereby said coil can provide low cost, highly efficient, high electromagnetic performance in an unsealed state in a high vacuum environment.

23. The method defined by claim 22 wherein said material consists of a metal having the same composition as said layer.

24. The method defined by claim 22 wherein said metal layer and said potting material has a melting temperature which is no greater than the decomposition temperature of said insulator.

25. The method defined by claim 24 wherein said metal layer and said potting material is pure or alloyed indium.

26. The method defined by claim 22 wherein said insulator is a polyimide.

27. The method of claims 18 or 22 wherein said coating of said wire insulator with said hermetic layer of low vapor pressure metal comprises cleaning said insulator with a solvent and immediately passing said wire through a melt of said metal before recontamination of said insulator can occur, whereby uniform wetting of said insulator by said metal is effected.

28. The method defined by claim 27 wherein said metal is indium.

29. The method defined by claim 27 wherein said insulator is a polyimide.

30. The method defined by claim 27 wherein said solvent is acetone.

* * * * *